(12) United States Patent
Karasawa

(10) Patent No.: US 12,512,751 B2
(45) Date of Patent: Dec. 30, 2025

(54) SWITCHING CIRCUIT

(71) Applicant: ROHM CO., LTD., Kyoto (JP)

(72) Inventor: Shinya Karasawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 597 days.

(21) Appl. No.: 17/960,528

(22) Filed: Oct. 5, 2022

(65) Prior Publication Data

US 2023/0023250 A1 Jan. 26, 2023

Related U.S. Application Data

(63) Continuation of application No. PCT/JP2021/012286, filed on Mar. 24, 2021.

(30) Foreign Application Priority Data

Apr. 6, 2020 (JP) ................................. 2020-068113

(51) Int. Cl.
*H02M 1/38* (2007.01)
*H02M 1/08* (2006.01)
*H02M 1/32* (2007.01)
*H02M 3/155* (2006.01)
*H03K 17/687* (2006.01)

(52) U.S. Cl.
CPC ............ *H02M 1/385* (2021.05); *H02M 1/08* (2013.01); *H02M 1/322* (2021.05); *H02M 3/155* (2013.01); *H03K 17/687* (2013.01)

(58) Field of Classification Search
CPC ........ H02M 1/385; H02M 1/322; H02M 1/08; H02M 1/158; H02M 1/33576; H02M 3/155; H03K 17/687; Y02B 70/10
See application file for complete search history.

(56) References Cited

U.S. PATENT DOCUMENTS

| | | | |
|---|---|---|---|
| 9,621,039 B2* | 4/2017 | Yamada | H02M 1/38 |
| 10,770,969 B2* | 9/2020 | Peretz | G05F 1/575 |
| 2006/0152204 A1* | 7/2006 | Maksimovic | H02M 3/1588 |
| | | | 323/284 |
| 2013/0265016 A1* | 10/2013 | Chang | H02M 3/1588 |
| | | | 323/271 |
| 2016/0011610 A1* | 1/2016 | Hayashi | H03K 17/162 |
| | | | 323/280 |

(Continued)

FOREIGN PATENT DOCUMENTS

| | | | |
|---|---|---|---|
| DE | 102017120269 A1 * | 3/2018 | |
| DE | 102017129983 A1 * | 6/2019 | |

OTHER PUBLICATIONS

Machine translation DE-102017120269-A1 (Year: 2018).*

(Continued)

*Primary Examiner* — Thienvu V Tran
*Assistant Examiner* — Yahveh Comas Torres
(74) *Attorney, Agent, or Firm* — CANTOR COLBURN LLP

(57) ABSTRACT

A switching controller generates control pulses for specifying on/off states of a first transistor and a second transistor. One end of a capacitor is coupled to a switching node. A constant voltage is applied to the other end of the capacitor via a rectifier element. A dead time controller controls a delay time between adjacent edges of the first control pulse and the second control pulse according to a sensing voltage across both ends of the capacitor.

22 Claims, 16 Drawing Sheets

(56) References Cited

U.S. PATENT DOCUMENTS

| | | | | |
|---|---|---|---|---|
| 2016/0036332 | A1* | 2/2016 | Yashiki | H02M 1/08 |
| | | | | 323/271 |
| 2016/0087543 | A1* | 3/2016 | Jin | H02M 1/38 |
| | | | | 363/21.03 |
| 2017/0155323 | A1* | 6/2017 | Umemoto | H02M 3/1588 |
| 2017/0324411 | A1* | 11/2017 | Gong | H02M 3/07 |
| 2018/0159529 | A1* | 6/2018 | Reusch | H03K 17/08122 |
| 2020/0036372 | A1* | 1/2020 | Shankar | H02M 1/08 |
| 2020/0162074 | A1* | 5/2020 | Niikura | H03K 17/04123 |
| 2020/0169160 | A1* | 5/2020 | Kikuchi | H02M 3/33571 |

OTHER PUBLICATIONS

Machine Translation DE-102017129983-A1 (Year: 2019).*
JPO Notification of Reason(s) for Refusal for corresponding JP Application No. 2022-514329; Issued Jul. 23, 2024.
International Preliminary Report on Patentability with Written Opinion of the International Searching Authority for International Application PCT/JP2021/012286; Date of Mailing Jun. 8, 2021.
International Search Report for International Application PCT/JP2021/012286; Date of Mailing Jun. 8, 2021.
Mappus, "Predictive Gate Drive Frequently Asked Questions", Texas Instruments, Application Report, Feb. 2003, 9 pages.

* cited by examiner

SWITCHING CIRCUIT

CROSS REFERENCE TO RELATED APPLICATIONS

This application is a continuation under 35 U.S.C. § 120 of PCT/JP2021/012286, filed Mar. 24, 2021, which is incorporated herein by reference, and which claimed priority to Japanese Application No. 2020-068113, filed Apr. 6, 2020. The present application likewise claims priority under 35 U.S.C. § 119 to Japanese Application No. 2020-068113, filed Apr. 6, 2020, year, the entire content of which is also incorporated herein by reference.

BACKGROUND

1. Technical Field

The present disclosure relates to a switching circuit.

2. Description of the Related Art

In the field of power electronics such as DC/DC converters, AC/DC converters, inverters, etc., switching circuits such as half-bridge circuits, full-bridge circuits, etc., are employed.

In the control of a switching circuit, in order to prevent a through current, dead time is inserted. As the dead time becomes longer, the risk of through current is reduced. However, during the dead time, current flows through a body diode of a transistor or a flyback diode (flywheel diode), leading to degradation of efficiency.

Accordingly, the dead time is preferably set to as short a period as possible in a range in which no through current flows.

In some cases, a switching transistor (power transistor) is configured as a discrete element that differs from a control circuit that generates a pulse signal for controlling the switching transistor. Also, in some cases, a gate driver for driving such a switching transistor is configured as an integrated circuit (IC) that differs from such a control circuit. In some cases, a transformer is further inserted between the control circuit and the switching transistor. In this case, the dead time must be determined giving consideration to the gate capacitance of the switching transistor, the delay time of the gate driver, and the delay time of the transformer. Conventionally, it has been necessary for the designer of the switching circuit to determine the dead time empirically or in a trial-and-error manner giving consideration to the characteristics of peripheral circuits.

In particular, in recent years, there has been movement toward replacing Si-FETs or Insulated Gate Bipolar Transistors (IGBTs), which are employed as switching transistors, by GaN-HEMTs, which are capable of faster switching. In this case, such an arrangement involves a reduction of the switching period. Accordingly, such an arrangement requires severe precision in a case of adjusting the length of the dead time.

SUMMARY

The present disclosure has been made in view of such a situation. Accordingly, it is an exemplary purpose of an embodiment according to the present disclosure to provide a switching circuit that is capable of optimizing the dead time.

An embodiment of the present disclosure relates to a switching circuit. The switching circuit includes: a first transistor and a second transistor; a switching node structured such that, during a period in which the first transistor is turned on and the second transistor is turned off, a high-level voltage occurs at the switching node, such that, during a period in which the first transistor is turned off and the second transistor is turned on, a low-level voltage occurs at the switching node, and such that, during a period in which both the first transistor and the second transistor are turned off, a negative voltage occurs at the switching node; a capacitor structured such that a first end thereof is coupled to the switching node; a rectifier element structured to apply a constant voltage to a second end of the capacitor; a switching controller structured to generate a first control pulse and a second control pulse for specifying on/off states of the first transistor and the second transistor; a first gate driver structured to drive the first transistor according to the first control pulse; a second gate driver structured to drive the second transistor according to the second control pulse; and a dead time controller structured to control a delay time between adjacent edges of the first control pulse and the second control pulse according to a sensing voltage across both ends of the capacitor.

Another embodiment of the present disclosure also relates to a switching circuit. The switching circuit includes: a first transistor and a second transistor; a switching node structured such that, during a period in which the first transistor is turned on and the second transistor is turned off, a high-level voltage occurs at the switching node, such that, during a period in which the first transistor is turned off and the second transistor is turned on, a low-level voltage occurs at the switching node, and such that, during a period in which both the first transistor and the second transistor are turned off, a negative voltage occurs at the switching node; a capacitor structured such that a first end thereof is coupled to the switching node; a rectifier element structured to apply a constant voltage to a second end of the capacitor; a switching controller structured to generate a first control pulse and a second control pulse for specifying on/off states of the first transistor and the second transistor; a first gate driver structured to drive the first transistor according to the first control pulse; a second gate driver structured to drive the second transistor according to the second control pulse; and a dead time controller structured to control a delay time of at least one from among the first gate driver and the second gate driver according to a sensing voltage across both ends of the capacitor.

Yet another embodiment of the present disclosure relates to a control circuit for a switching power supply. The switching circuit includes: a first transistor and a second transistor; a switching node structured such that, during a period in which the first transistor is turned on and the second transistor is turned off, a high-level voltage occurs at the switching node, such that, during a period in which the first transistor is turned off and the second transistor is turned on, a low-level voltage occurs at the switching node, and such that, during a period in which both the first transistor and the second transistor are turned off, a negative voltage occurs at the switching node; a capacitor structured such that a first end thereof is coupled to the switching node; a rectifier element structured to apply a constant voltage to a second end of the capacitor; a first gate driver structured to drive the first transistor according to the first control pulse; and a second gate driver structured to drive the second transistor according to the second control pulse. The control circuit includes: a switching controller structured to generate a first control pulse and a second control pulse for specifying on/off states of the first transistor and the second transistor; and a dead time controller structured to control a delay time between adjacent edges of the first control pulse and the second control pulse according to a sensing voltage across both ends of the capacitor.

Yet another embodiment of the present disclosure relates to a gate driver circuit for a switching power supply. The switching power supply includes: a first transistor and a second transistor; a switching node structured such that, during a period in which the first transistor is turned on and the second transistor is turned off, a high-level voltage occurs at the switching node, such that, during a period in which the first transistor is turned off and the second transistor is turned on, a low-level voltage occurs at the switching node, and such that, during a period in which both the first transistor and the second transistor are turned off, a negative voltage occurs at the switching node; a capacitor structured such that a first end thereof is coupled to the switching node; a rectifier element structured to apply a constant voltage to a second end of the capacitor; and a switching controller structured to generate a control signal for specifying a duty cycle of each of the first transistor and the second transistor such that an electrical state of the switching power supply approaches a target state. The gate driver circuit includes: a pulse generating unit structured to generate a first control pulse and a second control pulse each having a duty cycle that corresponds to the control signal; a first gate driver structured to drive the first transistor according to the first control pulse; a second gate driver structured to drive the second transistor according to the second control pulse; and a dead time controller structured to control a delay time between adjacent edges of the first control pulse and the second control pulse according to a sensing voltage across both ends of the capacitor.

It is to be noted that any arbitrary combination or rearrangement of the above-described structural components and so forth is effective as and encompassed by the present embodiments. Moreover, this summary does not necessarily describe all necessary features so that the disclosure may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
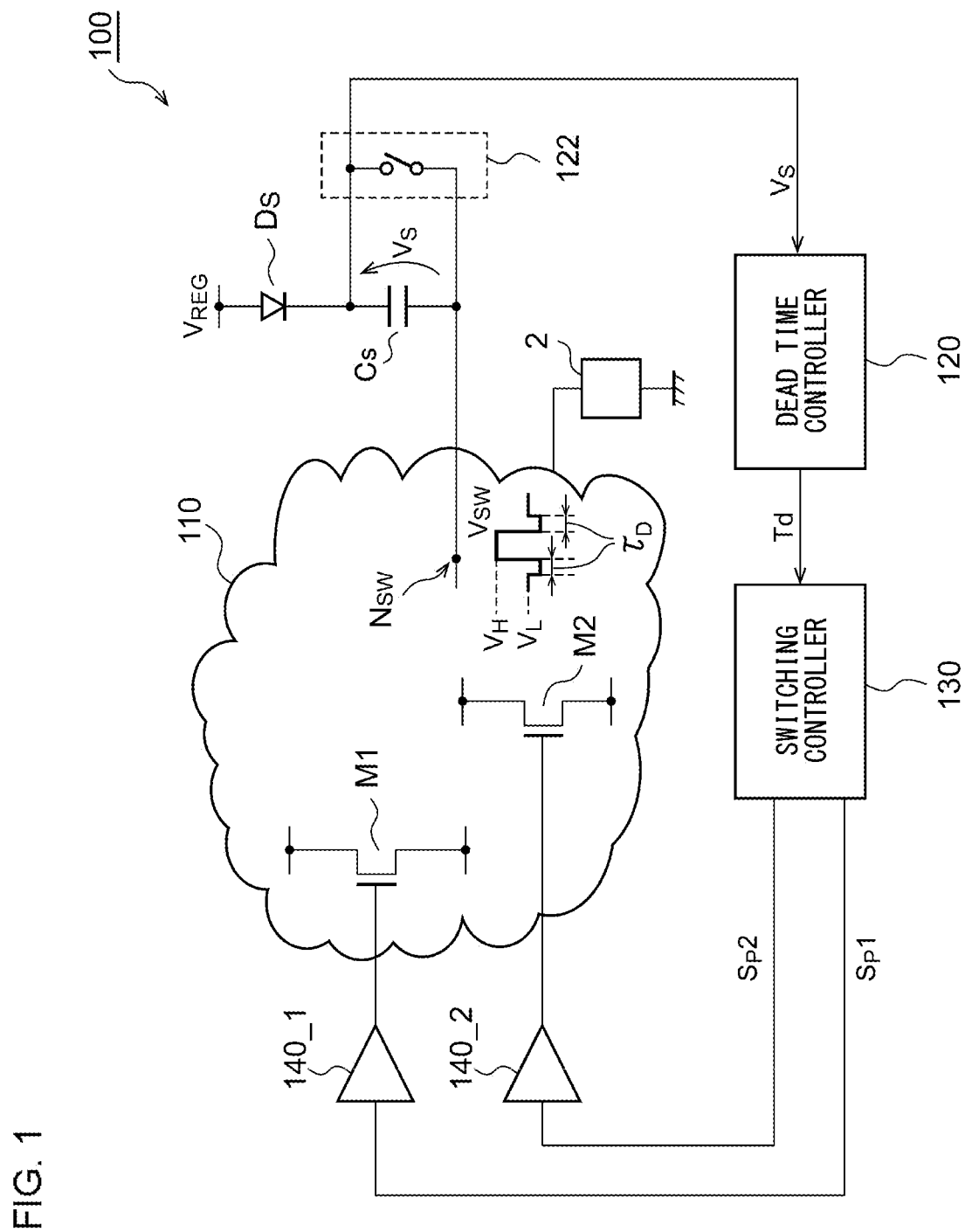
FIG. 1 is a circuit diagram of a switching circuit according to an embodiment 1.

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

Outline of Embodiments

A switching circuit according to an embodiment includes: a first transistor and a second transistor; a switching node, wherein a high-level voltage occurs at the switching node during a period in which the first transistor is turned on and the second transistor is turned off, a low-level voltage occurs at the switching node during a period in which the second transistor is turned off and the second transistor is turned on, and a negative voltage occurs at the switching node during a period in which both the first transistor and the second transistor are turned off; a capacitor structured such that a first end thereof is coupled to the switching node; a rectifier element structured to apply a constant voltage to a second end of the capacitor; a switching controller structured to generate a first control pulse and a second control pulse for specifying on/off states of the first transistor and the second transistor; a dead time controller structured to control a delay time between adjacent edges of the first control pulse and the second control pulse according to a sensing voltage across both ends of the capacitor; a first gate driver structured to drive the first transistor according to the first control pulse; and a second gate driver structured to drive the second transistor according to the second control pulse.

In this arrangement, there is a positive correlation between the voltage across both ends of the capacitor and the length of the dead time (which will also be referred to as a "high-impedance period") during which both the first transistor and the second transistor are turned off. Accordingly, by monitoring the sensing voltage across both ends of the capacitor, such an arrangement is capable of detecting the actual length of the dead time. Furthermore, by optimizing the delay time between edges of the control pulses according to the sensing voltage thus detected (i.e., the length of dead time), such an arrangement is capable of optimizing the length of the dead time during which the first transistor and the second transistor are actually turned off.

A switching circuit according to another embodiment includes: a first transistor and a second transistor; a switching node, wherein a high-level voltage occurs at the switching node during a period in which the first transistor is turned on and the second transistor is turned off, a low-level voltage occurs at the switching node during a period in which the second transistor is turned off and the second transistor is turned on, and a negative voltage occurs at the switching node during a period in which both the first transistor and the second transistor are turned off; a rectifier element structured to apply a constant voltage to a second end of the capacitor; a switching controller structured to generate a first control pulse and a second control pulse for specifying on/off states of the first transistor and the second transistor; a first gate driver structured to drive the first transistor according to the first control pulse; a second gate driver structured to drive the second transistor according to the second control pulse; and a dead time controller structured to control a delay time of at least one from among the first gate driver and the second gate driver according to a sensing voltage across both ends of the capacitor.

With this arrangement, by optimizing the delay time of the gate driver, such an arrangement is capable of optimizing the length of the dead time during which the first transistor and the second transistor are actually turned off.

Also, the dead time controller may include a comparator structured to compare a voltage across both ends of the capacitor with a predetermined target voltage. Also, the dead time controller may increase or decrease the delay time between the edges according to an output of the comparator. It should be noted that the comparator may be configured as a digital comparator or an analog comparator.

Also, the dead time controller may feedback control the delay time between the edges such that a voltage across both ends of the capacitor approaches a predetermined target voltage. The dead time controller may be configured as a digital circuit including a PI controller or a PID controller. Also, the dead time controller may be configured as an analog circuit including an error amplifier.

Also, the dead time controller may independently control the delay time when the first transistor is turned on and the delay time when the second transistor is turned on.

Also, the switching circuit may further include a discharge circuit coupled to the capacitor and structured to discharge a charge stored in the capacitor in a period in which the first transistor is turned on.

Also, the switching power supply may further include a transformer comprising a primary winding and a secondary winding. Also, the first transistor may be coupled to the primary winding. Also, the second transistor may be coupled to the secondary winding. A connection node that couples the secondary winding and the second transistor may be employed as the switching node.

Also, the first transistor and the second transistor may be coupled in series. Also, a connection node that couples the first transistor and the second transistor may be employed as the switching node.

DETAILED DESCRIPTION OF EMBODIMENTS

Description will be made below regarding preferred embodiments with reference to the drawings. The same or similar components, members, and processes are denoted by the same reference numerals, and redundant description thereof will be omitted as appropriate. The embodiments have been described for exemplary purposes only and are by no means intended to restrict the present invention. Also, it is not necessarily essential for the present invention that all the features or a combination thereof be provided as described in the embodiments.

In the present specification, the state represented by the phrase "the member A is coupled to the member B" includes a state in which the member A is indirectly coupled to the member B via another member that does not substantially affect the electrical connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electrical connection between them, or that does not damage the functions or effects of the connection between them, in addition to a state in which they are directly coupled.

Embodiment 1

FIG. 1 is a circuit diagram showing a switching circuit 100 according to an embodiment 1. The switching circuit 100 includes a main circuit 110, a sensing capacitor Cs, a rectifier element Ds, a dead time controller 120, a switching controller 130, and gate drivers 140_1 and 140_2.

The main circuit 110 includes a first transistor M1 and a second transistor M2. The main circuit 110 is coupled to a load 2. The load 2 receives a supply of power that corresponds to the on/off states of the first transistor M1 and the second transistor M2. Typically, the main circuit 110 may be part of a switching power supply such as a DC/DC converter, inverter, or converter. As described later, various kinds of variations are known for the circuit configuration of the main circuit 110. The configuration of the main circuit 110 is not restricted in particular. In some cases, the first transistor M1 and the second transistor M2 are directly coupled. Also, in some cases, the first transistor M1 and the second transistor M2 are coupled via a transformer.

The switching controller 130 controls at least one from among the voltage, current, and electric power supplied to the load 2, and the state of the load 2, as its control target. The switching controller 130 generates control pulses Sp1 and Sp2 for determining the on/off states of the first transistor M1 and the second transistor M2. The gate driver 140_1 drives the first transistor M1 according to the first control pulse Sp1. Furthermore, the gate driver 140_2 drives the second transistor M2 according to the second control pulse Sp2.

In the switching controller 130, an intentional control delay Td is set between the edges of the first control pulse Sp1 and the second control pulse Sp2. The control delay (in some cases, this control delay will also be referred to as "dead time") Td is set so as to insert a period (dead time $\tau_D$) during which both the first transistor M1 and the second transistor M2 are turned off. It should be noted that the control delay Td is dead time from the design viewpoint. However, the length of the actual dead time $\tau_D$ does not necessarily match the control delay Td. This is because the two control pulses Sp1 and Sp2 do not necessarily have the same delay time required for them to reach the corresponding gates. Furthermore, in a case in which there is a difference in the gate capacitance between the first transistor M1 and the second transistor M2, there is a difference in the turn-on delay (turn-off delay) between them.

The main circuit 110 includes a switching node Nsw. During a period in which the first transistor M1 is turned on and the second transistor M2 is turned off, a high-level voltage $V_H$ is generated at the switching node Nsw. During a period in which the second transistor M2 is turned on and the first transistor M1 is turned off, a low-level voltage $V_L$ is generated at the switching node Nsw. During a dead time (which will also be referred to as a "high-impedance period") $\tau_D$, in which both the first transistor M1 and the second transistor M2 are turned off, a negative voltage, i.e., $-V_{NEG}$ is generated.

One end of the sensing capacitor Cs is coupled to the switching node Nsw. A positive constant voltage $V_{REG}$ is applied to the other end of the sensing capacitor Cs via the rectifier element Ds. Typically, as the rectifier element Ds, a diode may be employed. Also, a transistor may be employed as a substitution thereof. As the constant voltage $V_{REG}$, the power supply voltage may be employed. Also, a reference voltage may be employed.

The dead time controller 120 detects the dead time $\tau_D$, generated by the switching controller 130 based on the sensing voltage Vs across both ends of the sensing capacitor Cs, and optimizes the settings of the switching controller 130.

A discharge circuit 122 is coupled to the sensing capacitor Cs. When the discharge circuit 122 is enabled, the charge stored in the sensing capacitor Cs is discharged. For example, the discharge circuit 122 may include a switch coupled in parallel with the sensing capacitor Cs.

The switching controller 130 may control the enable (active) state/disable (inactive) state of the discharge circuit 122 in synchronization with the on/off states of the control pulses Sp1 and Sp2. For example, during an on period of the first transistor M1, i.e., during a period in which the switching voltage Vsw is set to the high-level voltage $V_H$, the discharge circuit 122 may be enabled. During the remaining period, the discharge circuit 122 may be disabled.

The above is the configuration of the switching circuit 100. Next, description will be made regarding the operation thereof.

Figure 2:
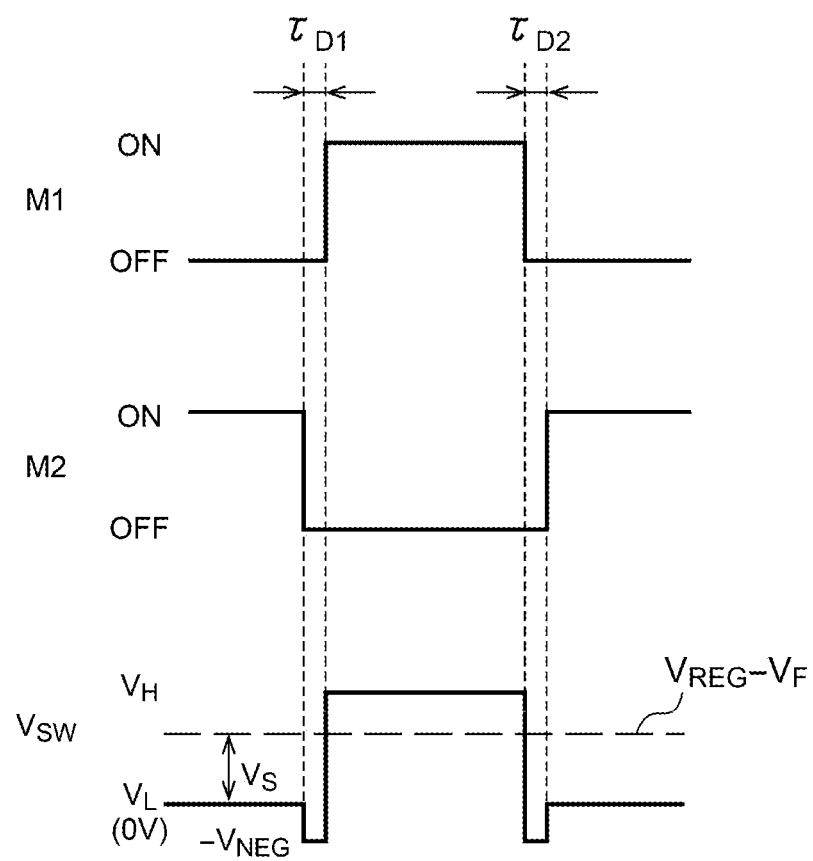
FIG. 2 is an operation waveform diagram of the switching circuit shown in FIG. 1.

FIG. 2 is an operation waveform diagram of the switching circuit 100 shown in FIG. 1. During the on period of the first transistor M1, the switching voltage Vsw is set to the high-level voltage $V_H$. During the on period of the second transistor M2, the switching voltage Vsw is set to the low-level voltage $V_L$ (0 V). During a dead time $\tau_D$, period in which both the first transistor M1 and the second transistor M2 are turned off, the switching voltage Vsw is set to a negative voltage $-V_{NEG}$ The magnitude $V_{NEG}$ of the negative voltage $-V_{NEG}$ depends on the kind of the second transistor M2. For example, in a case in which the second transistor M2 is configured as a Si-MOSFET, the forward voltage Vf of the body diode thereof becomes the magnitude $V_{NEG}$ of the negative voltage. Specifically, in this case, the magnitude of the negative voltage is on the order of 0.5 to 1 V. In a case in which the second transistor M2 is configured as a GaN-HEMT, the drain-source voltage VDS is the magnitude of the negative voltage $V_{NEG}$ Specifically, in this case, the magnitude of the negative voltage is on the order of several V.

The switching voltage Vsw is applied to one end of the sensing capacitor Cs, and $(V_{REG}-V_F)$ is applied to the other end thereof. Here, $V_F$ represents the forward voltage of the rectifier diode. Accordingly, during a period in which $(V_{REG}-V_F)>$Vsw holds true, $(V_{REG}-V_F)-$Vsw is applied across both ends of the sensing capacitor Cs.

Figure 3:
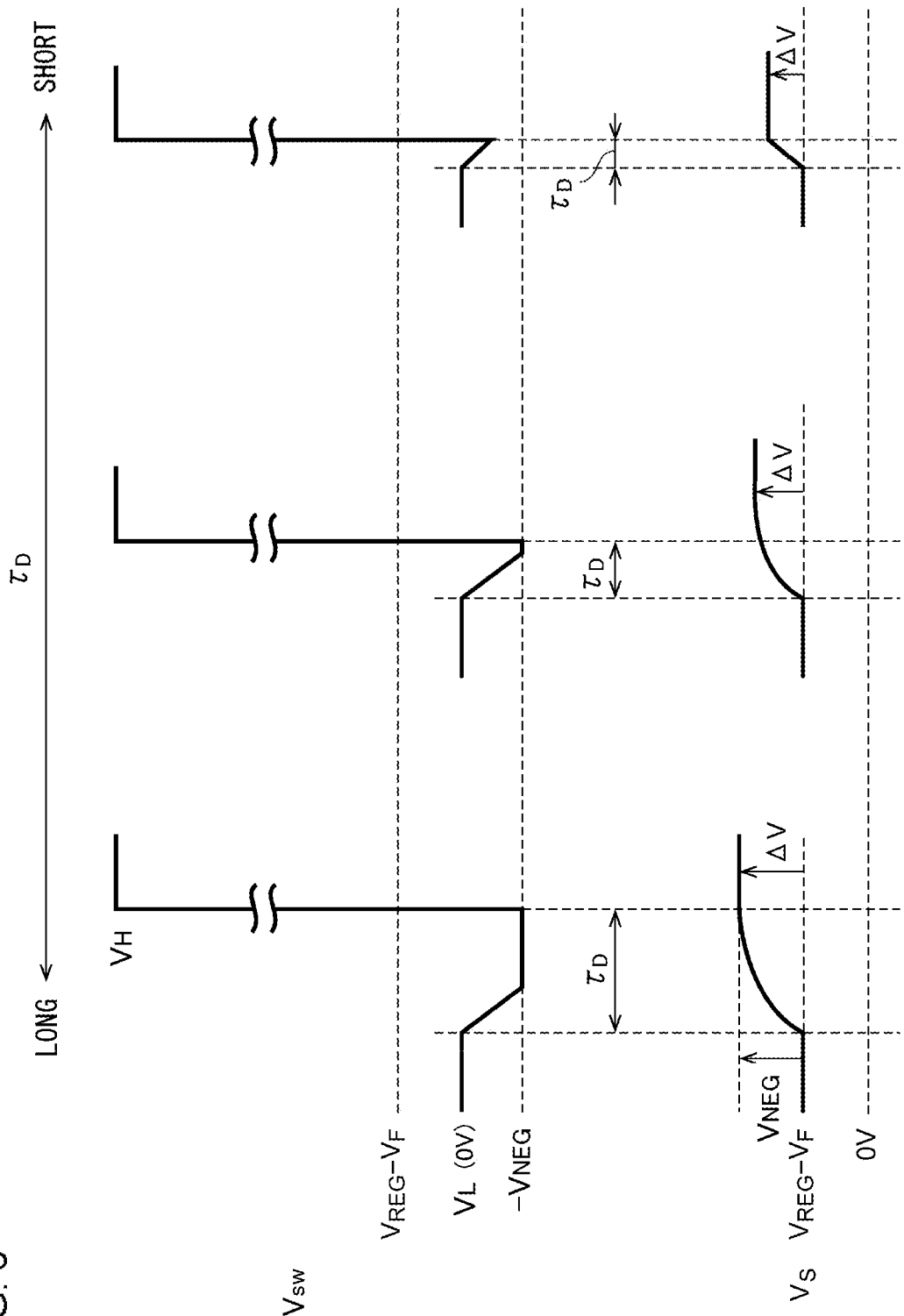
FIG. 3 is a diagram for explaining charging of a sensing capacitor Cs.

FIG. 3 is a diagram for explaining the charging of the sensing capacitor Cs. During a period in which the switching voltage Vsw is set to the low level (0 V), a low-level voltage $V_L$ (0 V) is applied to one end of the sensing capacitor Cs, and $(V_{REG}-V_F)$ is applied to the other end thereof. Accordingly, the voltage Vs applied across both ends of the sensing capacitor Cs is $(V_{REG}-V_F)$. Subsequently, during the dead time $\tau_D$, in which the voltage Vsw applied to the one end of the sensing capacitor Cs becomes a negative voltage, i.e., $-V_{NEG}$, the sensing capacitor Cs is further charged, thereby further raising the voltage Vc across both ends of the sensing capacitor Cs. As the dead time $\tau_D$, becomes longer, the extent of the increase ΔV of the voltage Vc becomes larger. Conversely, as the dead time $\tau_D$ becomes shorter, the extent of the increase ΔV of the voltage Vc becomes smaller. That is to say, as the dead time $\tau_D$ becomes longer, the sensing voltage Vs becomes higher. Conversely, as the dead time $\tau_D$, becomes shorter, the sensing voltage Vs becomes lower.

Figure 4:
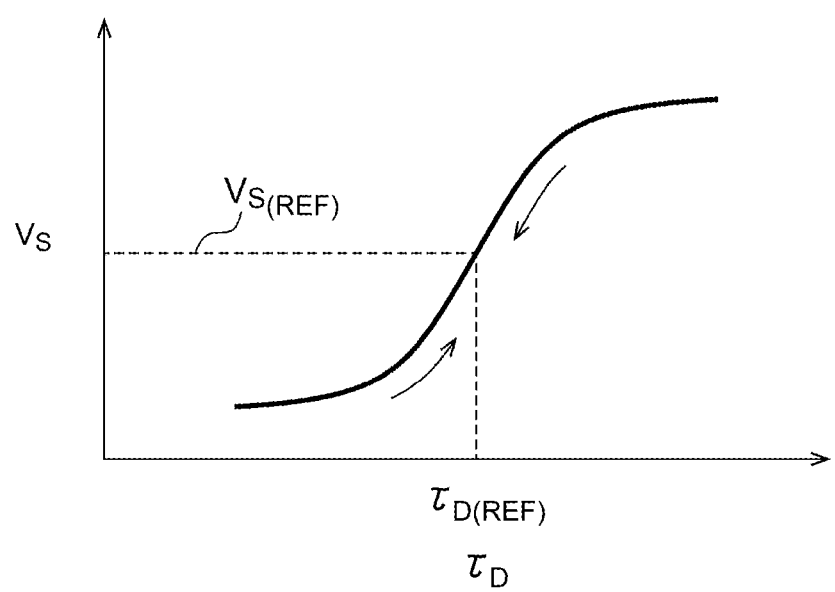
FIG. 4 is a diagram showing a relation between the length of dead time $\tau_D$ and the sensing voltage Vs.

FIG. 4 is a diagram showing the relation between the length of the dead time $\tau_D$ and the sensing voltage Vs. The sensing voltage Vs monotonically increases according to an increase in the dead time $\tau_D$. That is to say, the sensing voltage Vs and the actual dead time $\tau_D$, have a one-to-one relation.

Accordingly, the dead time controller 120 sets the target value $Vs_{(REF)}$ for the sensing voltage Vs. The dead time controller 120 executes control such that, when the sensing voltage Vs is higher than the target value $Vs_{(REF)}$, the control delay Td is shortened, and such that, when the sensing voltage Vs is lower than the target value $Vs_{(REF)}$, the control delay Td is lengthened. With this, such an arrangement is capable of optimizing the length of the dead time $\tau_D$, to a length $\tau_{D(REF)}$ that corresponds to the target value $Vs_{(REF)}$.

Figure 5A:
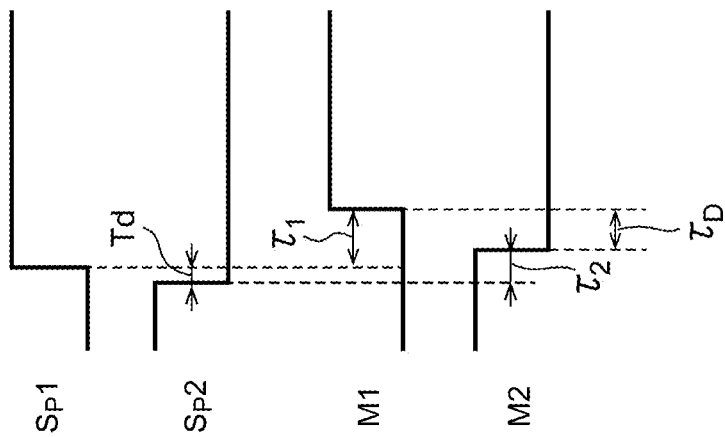
FIG. 5A through FIG. 5C are diagrams for explaining the advantages of the switching circuit.
Figure 5B:
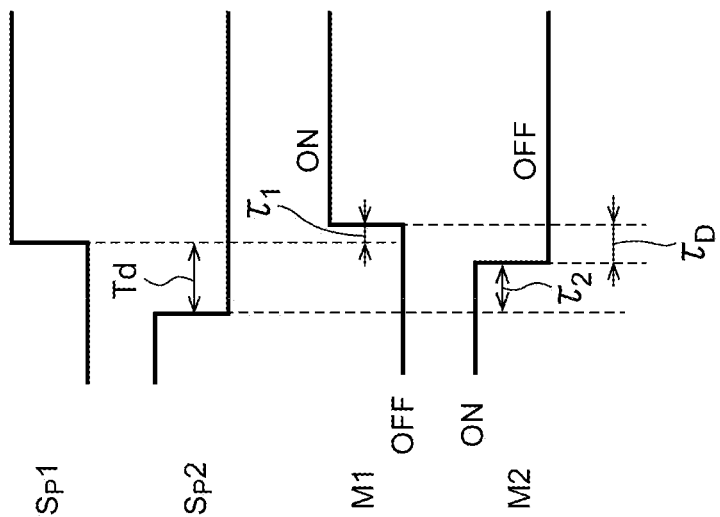
Figure 5C:
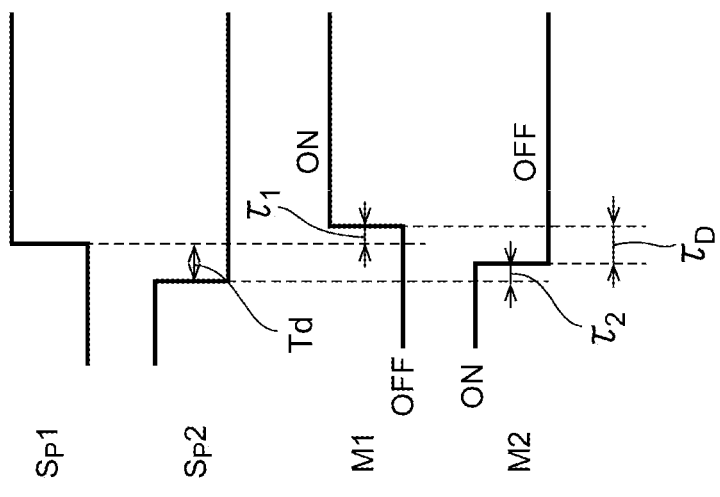

FIG. 5A through FIG. 5C are diagrams for explaining the advantages of the switching circuit 100. FIGS. 5A through FIG. 5C each show the control pulses Sp1 and SP2 and the actual on/off states of the first transistor M1 and the second transistor M2. After the elapse of the off delay time $\tau_2$ after the control pulse Sp2 transits from the high level (on level) to the low level (off level), the second transistor M2 is turned off. Furthermore, after the elapse of the on delay time $\tau_1$ after the control pulse Sp1 transits from the low level (off level) to the high level (on level), the first transistor M1 is turned on.

The delay times $\tau_1$ and $\tau_2$ are affected by the capability of the gate driver, the element sizes of the first transistor M1 and the second transistor M2, parasitic impedance in wiring, etc. FIG. 5A through FIG. 5C show operations with different delay times $\tau_1$ and $\tau_2$.

In the present embodiment, the control delay Td, which is a delay time that occurs in the level transition of the control pulses Sp1 and Sp2, is adjusted such that the sensing voltage Vs approaches the target voltage $Vs_{(REF)}$, i.e., such that the length of the dead time $\tau_D$ during which both the first transistor M1 and the second transistor M2 are turned off approaches the target value $\tau_{D(REF)}$. FIG. 5A shows a case in which $\tau_1=\tau_2$. In this state, the length of the dead time $\tau_D$ is substantially equal to the control delay Td.

FIG. 5B shows a case in which $\tau_1>\tau_2$. In this state, feedback control is applied such that the length of the dead time $\tau_D$, approaches the target value, thereby lengthening the control delay Td.

FIG. 5C shows a case in which $\tau_1 < \tau_2$. In this state, feedback control is applied such that the length of the dead time $\tau_D$, approaches the target value, thereby shortening the control delay Td.

As described above, with the present embodiment, by optimizing the control delay Td, this is capable of canceling out the effects of fluctuation and variation of the on delay time and the off delay time.

Figure 6:
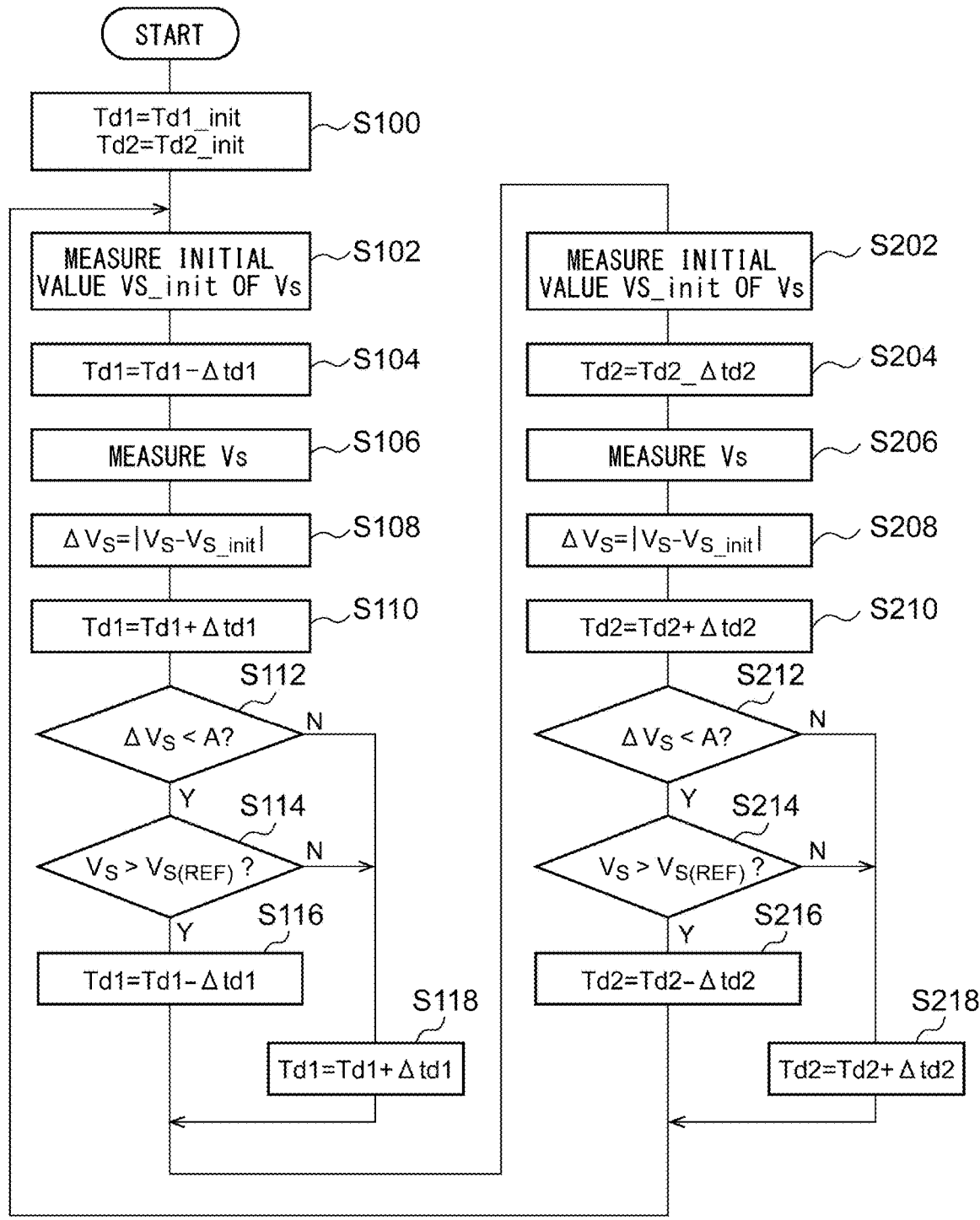
FIG. 6 is a flowchart showing optimization processing of a control delay Td by a dead time controller shown in FIG. 1.

FIG. 6 is a flowchart of the optimization processing of the control delay Td provided by the dead time controller 120 shown in FIG. 1. As shown in FIG. 2, the dead time $\tau_D$, is classified into $\tau_{D1}$ immediately after the turn-off of the second transistor M2 (immediately before the first transistor M1 is turned on) and $\tau_{D2}$ immediately after the turn-off of the first transistor M1 (immediately before the second transistor M2 is turned on). The two kinds of dead time are affected by independent variation factors. Accordingly, the dead time controller 120 may preferably independently optimize the two dead times (control delays) Td1 and Td2 that correspond to the two dead times $\tau_{D1}$ and $\tau_{D2}$. The control delay Td1 is a delay time between the negative edge of the control pulse Sp2 and the positive edge of the control pulse Sp1. The control delay Td2 is a delay time between the negative edge of the control pulse Sp1 and the positive edge of the control pulse Sp2.

First, initial values Td1_innit and Td2_init are set to the two dead times Td1 and Td2 (S100).

Subsequently, the initial value Vs_init of the sensing voltage Vs is measured (S102). Subsequently, a perturbation is applied to the dead time Td1 (S104). In order to raise the efficiency, the dead time is preferably be set to as short a period as possible in a range in which no through current flows. Accordingly, the perturbation is applied in a direction in which the dead time T1 is reduced. Here, Δtd1 represents a predetermined extent of perturbation.

$$Td1 = Td1 - \Delta td1$$

After the perturbation is applied, the sensing voltage Vs is measured (S106). The amount of change in the sensing voltage Vs due to the perturbation, i.e., ΔVs=|Vs−Vs_init|, is calculated (S108). In this state, the perturbation is released (S110).

$$Td1 = Td1 + \Delta td1$$

As shown in FIG. 4, in a range in which the dead time $\tau_D$ (i.e., dead times Td1 and Td2) is small, the sensitivity of the sensing voltage Vs with respect to the dead times Td1 and Td2 decreases. In this range, the risk of through current flowing becomes high. In order to avoid this risk, the extent of the change ΔVs due to perturbation is compared with a very small threshold value A (S112). When ΔVs<A holds true (YES in S112), this leads to a risk of through current flowing. In order to avoid such a risk, the dead time Td1 is increased (S116).

When ΔVs>A holds true (NO in S112), it can be said that the risk that a through current flows is low. In this case, Vs is compared with its target level $Vs_{(REF)}$ (S114). When $Vs > Vs_{(REF)}$ holds true (YES in S114), the dead time Td1 is decreased (S116). Conversely, when $Vs < Vs_{(REF)}$ holds true (NO in S114), the dead time Td1 is increased (S118).

In Steps S202 through S208, the same processing executed in Steps S102 through 118 is executed for Td2. It should be noted that the method for optimizing the dead times Td1 and Td2 is not restricted to the method described above.

The optimization of the dead times Td1 and Td2 may be executed at all times in the operation of the switching circuit 100. Also, the optimization of the dead times Td1 and Td2 may be intermittently executed. Alternatively, the optimization of the dead times Td1 and Td2 may be executed before shipment of a final product including the switching circuit 100. In this case, the dead times Td1 and Td2 acquired in this optimization may be stored in nonvolatile memory. In the operation, the dead times Td1 and Td2 loaded from the nonvolatile memory may be used.

The present invention encompasses various kinds of apparatuses and methods that can be regarded as a block configuration or a circuit configuration shown in FIG. 1, or otherwise that can be derived from the aforementioned description. That is to say, the present invention is not restricted to a specific configuration. More specific description will be made below regarding example configurations and examples for clarification and ease of understanding of the essence of the present invention and the operation thereof. That is to say, the following description will by no means be intended to restrict the technical scope of the present invention.

Example 1

Figure 7:
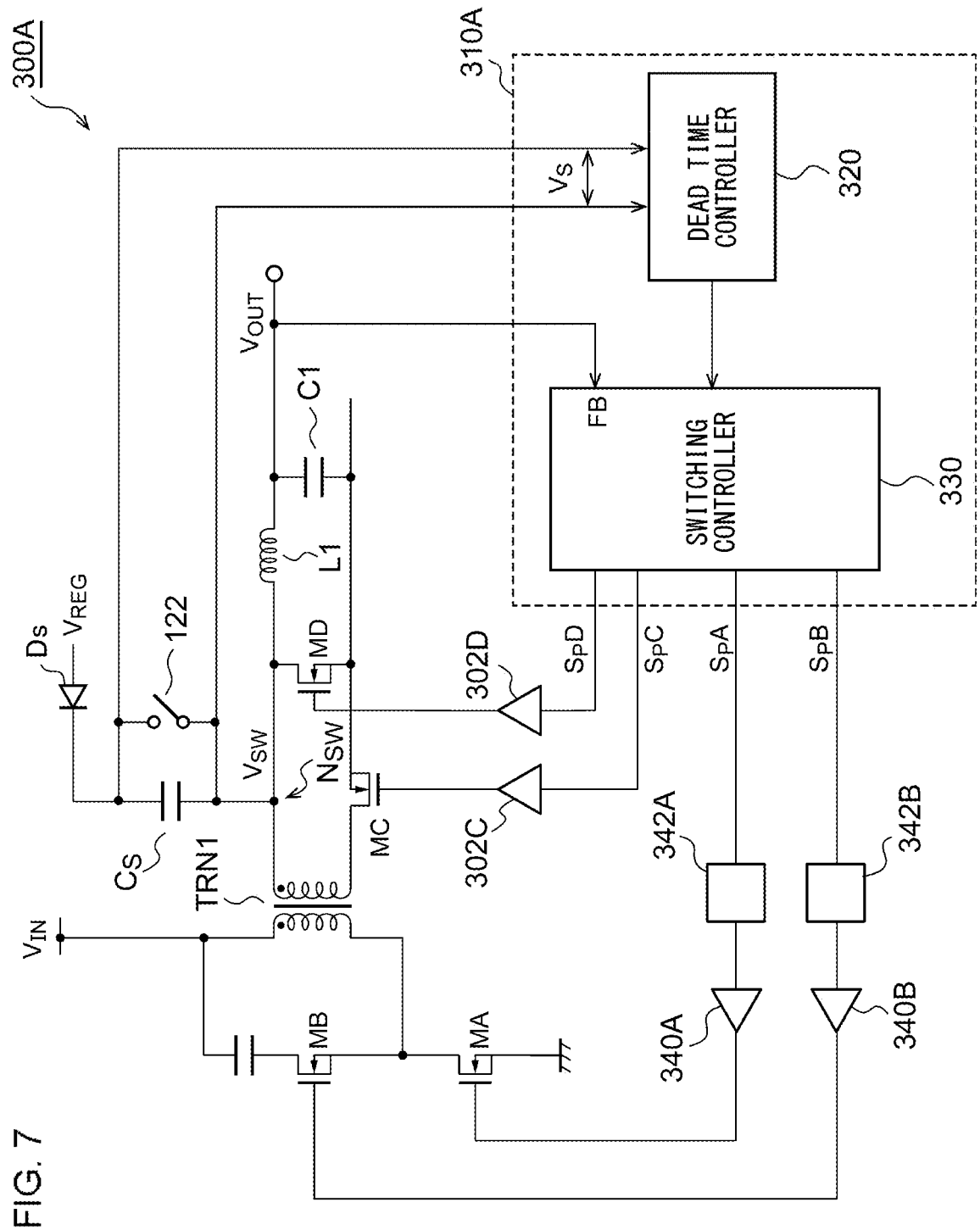
FIG. 7 is a circuit diagram of a switching power supply according to an example 1.

FIG. 7 is a circuit diagram of a switching power supply 300A according to an example 1. The switching power supply 300A is configured as a forward converter and is provided with an architecture of the switching circuit 100 described above.

The switching power supply 300A includes a transformer TRN1, four transistors MA through MD, gate drivers 340A, 340B, 302C and 302D, isolators 342A and 342B, a dead time controller 320, and a switching controller 330. In the switching power supply 300A, the primary side and the secondary side are insulated from each other by the transformer TRN1 and the isolators 342A and 342B. The dead time controller 320 and the switching controller 330 may be integrated in a single control circuit 310A. The discharge circuit 122 may be integrated in the control circuit 310A.

The switching controller 330 generates control pulses SpA through SpD such that the output voltage $V_{OUT}$ (or a different electrical state) of the switching power supply 300A approaches a target value. The configuration or control method of the switching controller 330 is not restricted in particular. Also, known techniques may preferably be employed. For example, the switching controller 330 may generate a duty cycle command value for adjusting the duty cycle, frequency, or the like, such that the output voltage $V_{OUT}$ approaches the target value and may generate an internal pulse dpwm that corresponds to the duty cycle command value. With this, by applying an appropriate control delay to a positive edge and negative edge of the internal pulse dpwm, the control pulses SpA through SpD may be generated. Alternatively, the duty cycle command value may be directly converted into the control pulses SpA through SpD.

The gate drivers 340A and 340B receive the control pulses SpA and SpB via the isolators 342A and 342B, so as to drive the transistors MA and MB on the primary side. The gate drivers 340C and 340D receive the control pulses SpC and SpD, so as to drive the transistors MC and MD on the secondary side.

In this example, the pair of the transistor MB on the primary side and the transistor MD on the secondary side correspond to the first transistor M1 and the second transistor M2 described above. A connection node that couples a secondary winding Ws of the transformer TRN1 and the transistor M2 is employed as the switching node Nsw described above. One end of the sensing capacitor Cs is coupled to the switching node Nsw.

The dead time controller 320 optimizes the control delay Td between the control pulses SpA and SpD based on the sensing voltage Vs across both ends of the sensing capacitor Cs.

Figure 8:
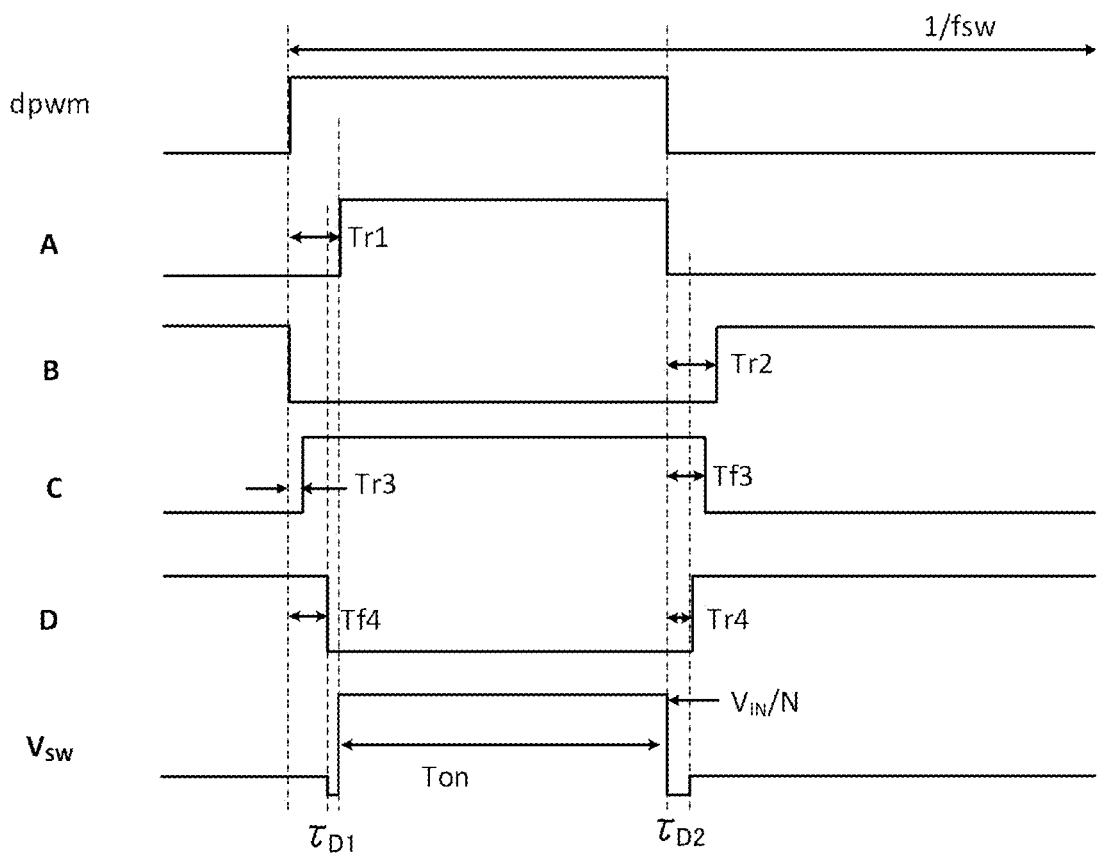
FIG. 8 is an operation waveform diagram of the switching power supply shown in FIG. 7.

The above is the configuration of the switching power supply 300A. FIG. 8 is an operation waveform diagram of the switching power supply 300A shown in FIG. 7. Here, "A" through "D" represent the on/off states of the transistors MA through MD. The high level of the switching voltage Vsw is represented by VIN/N. Here, "N" represents the winding ratio of the transformer TRN1. As the low level, the ground voltage is employed. During the dead time $\tau_D$, the switching voltage Vsw becomes negative. With the switching power supply 300A, this is capable of optimizing the dead time $\tau_D$.

Figure 9:
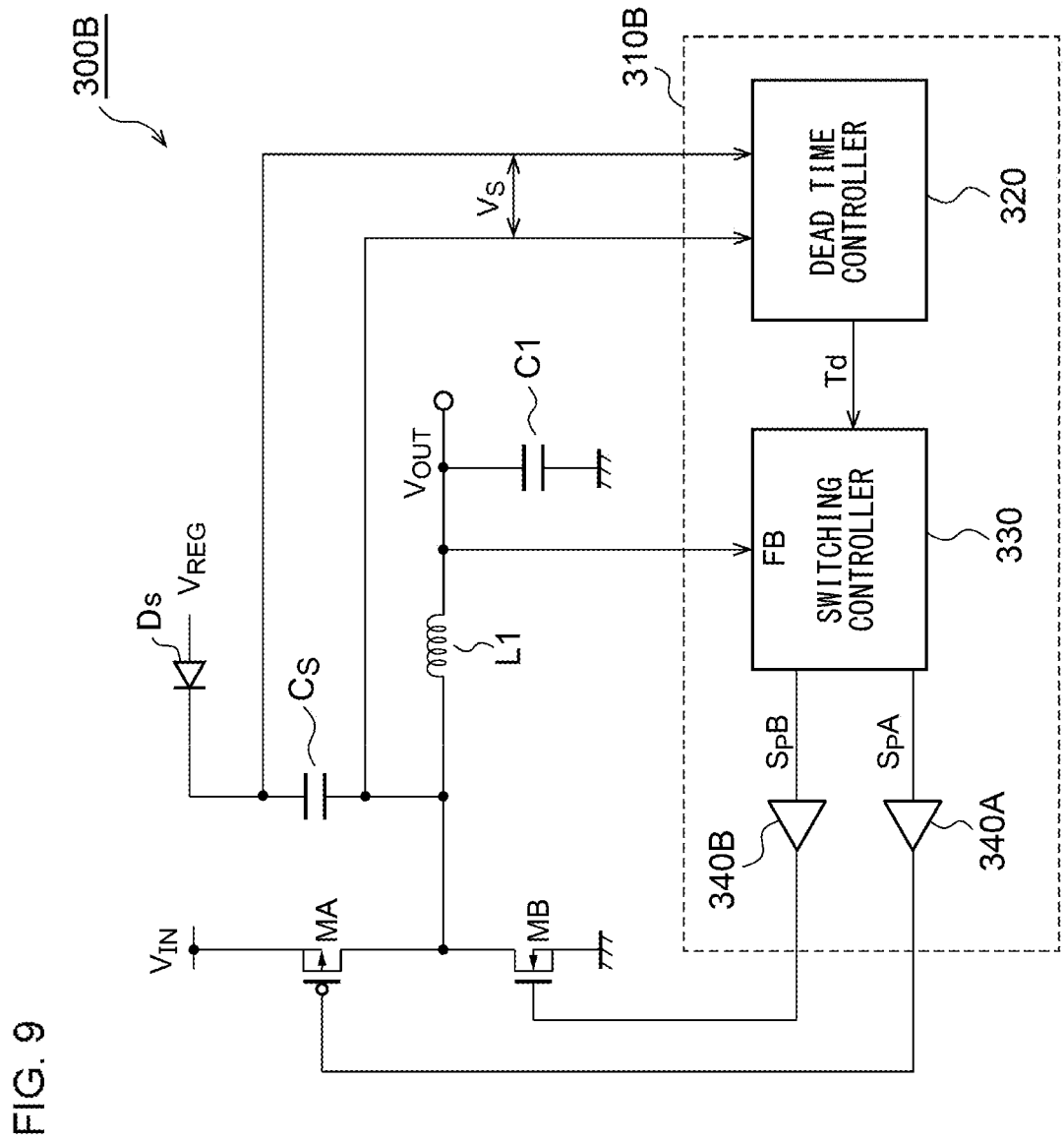
FIG. 9 shows a circuit of a switching power supply according to an example 2.

FIG. 9 is a circuit diagram of a switching power supply 300B according to an example 2. The switching power supply 300B is configured as a non-insulating DC/DC converter (step-down converter). The step-down converter includes a high-side transistor MB (switching transistor), a low-side transistor (synchronous rectification transistor) MA, an inductor L1, a capacitor C1, a sensing capacitor Cs, a rectifier element Ds, a dead time controller 320, a switching controller 330, and gate drivers 340A and 340B.

The dead time controller 320 and the switching controller 330 may be integrated in a single control circuit 310B. Furthermore, the gate drivers 340A and 340B and the discharge circuit 122 may be integrated in the control circuit 310B.

The switching controller 330 generates control pulses SpA and SpB such that the output voltage $V_{OUT}$ (or a different electrical state) of the switching power supply 300B approaches a target value. The configuration or control method of the switching controller 330 is not restricted in particular. Also, known techniques may preferably be employed. For example, the switching controller 330 may generate a duty cycle command value for adjusting the duty cycle, frequency, or the like, such that the output voltage $V_{OUT}$ approaches the target value and may generate an internal pulse dpwm that corresponds to the duty cycle command value. With this, by applying an appropriate control delay to a positive edge and negative edge of the internal pulse dpwm, the control pulses SpA and SpB may be generated. Alternatively, the duty cycle command value may be directly converted into the control pulses SpA and SpB.

The gate drivers 340A and 340B drive the transistors MA and MB according to the control pulses SpA and Sp2.

With this example, the high-side transistor MB and the low-side transistor MA correspond to the first transistor M1 and the second transistor M2 described above. A connection node that couples the two transistors is employed as the switching node Nsw. One end of the sensing capacitor Cs is coupled to the switching node Nsw.

The dead time controller 320 optimizes the control delay Td between the control pulses SpA and SpB based on the sensing voltage Vs across both ends of the sensing capacitor Cs.

Example 3

Figure 10:
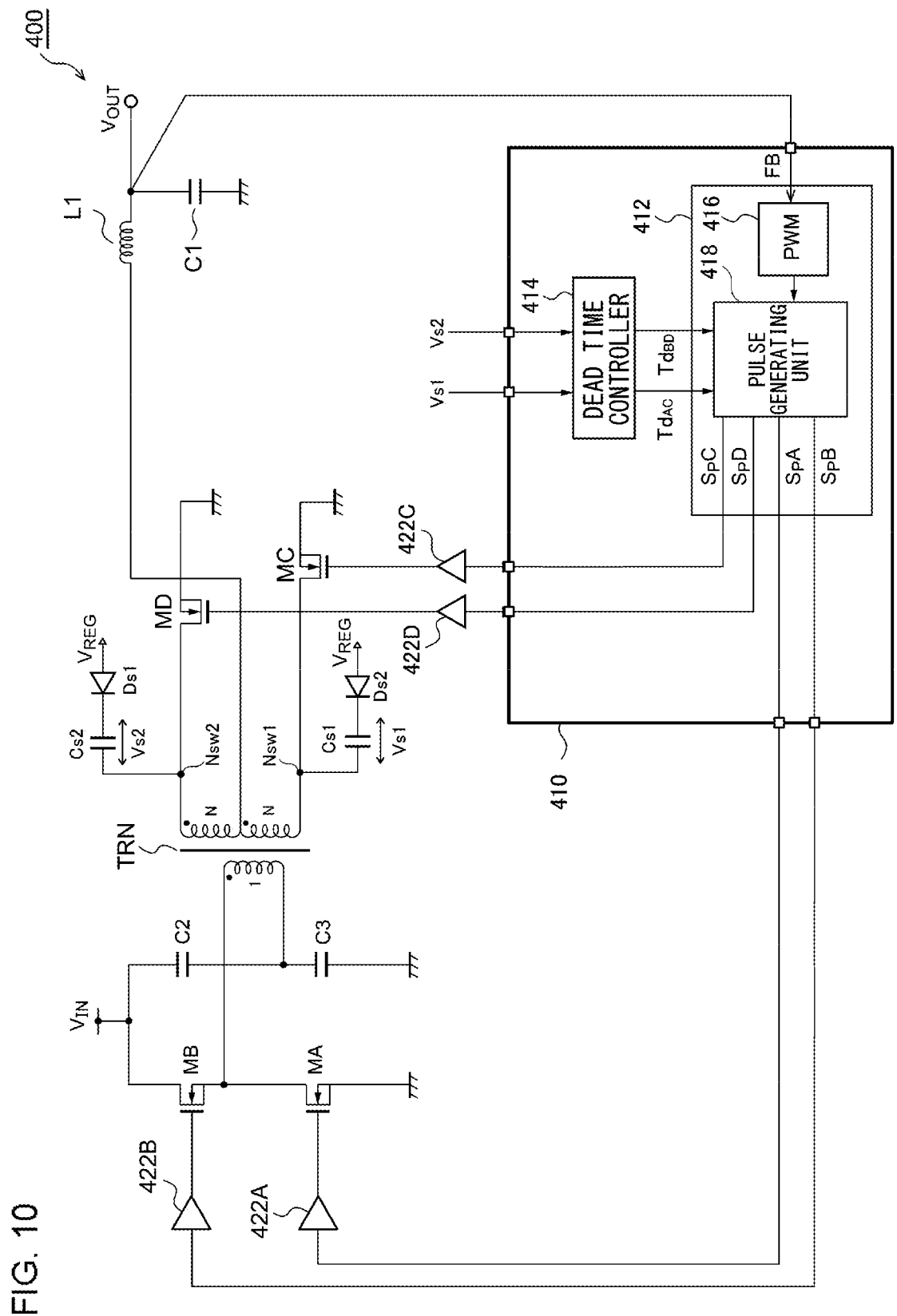
FIG. 10 is a block diagram showing a switching power supply according to an example 3.

FIG. 10 is a block diagram showing a switching power supply 400 according to an example 3. The switching power supply 400 is configured as a half-bridge converter including a transformer TRN1, transistors MA through MD, capacitors C1 through C3, a control circuit 410, gate drivers 422A through 422D, sensing capacitors Cs1 and Cs2, and rectifier elements Ds1 and Ds2.

The control circuit 410 includes a switching controller 412 and a dead time controller 414. The switching controller 412 generates the control pulses SpA through SpD such that the output voltage $V_{OUT}$ (or a different electrical state) of the switching power supply 400 approaches a target value.

The control pulses SpA and SpB are input to the gate drivers 422A and 422B. In a case of employing an insulated application, an isolator is additionally provided between a pair of gate drivers 422A and 422B and the control circuit 410.

With such a half-bridge converter, the pair of transistors MA and MC are switched on and off in a complementary manner, and the pair of transistors MB and MD are switched on and off in a complementary manner. Accordingly, a first control delay $Td_{AC}$ is provided between the control pulses SpA and SpC. Furthermore, a second control delay $Td_{BD}$ is provided between the control pulses SpB and SpD.

The drain of the transistor MC is employed as a first switching node Nsw1, which is coupled to the capacitor Cs1 and the diode Ds1. The dead time controller 414 adjusts the first control delay $Td_{AC}$ based on a sensing voltage Vs1 at the capacitor Cs1. Furthermore, the drain of the transistor MD is employed as a second switching node Nsw2, which is coupled to the capacitor Cs2 and the diode Ds2. The dead time controller 414 adjusts the second control delay $Td_{BD}$ based on a sensing voltage Vs2 at the capacitor Cs2.

For example, the switching controller 412 includes a pulse width modulator 416 and a pulse generating unit 418. The pulse width modulator 416 feedback controls a duty cycle Don such that the output voltage $V_{OUT}$ (or a different electrical state) of the switching power supply 400 approaches its target value. A signal that corresponds to the duty cycle Don is supplied from the pulse width modulator 416 to the pulse generating unit 418. The pulse generating unit 418 generates the control pulses SpA through SpD based on the duty cycle Don generated by the pulse width modulator 416 and the control delays $Td_{AC}$ and $Td_{BD}$. The configuration and the control method of the switching controller 412 are not restricted in particular. Also, known techniques may preferably be employed.

Figure 11:
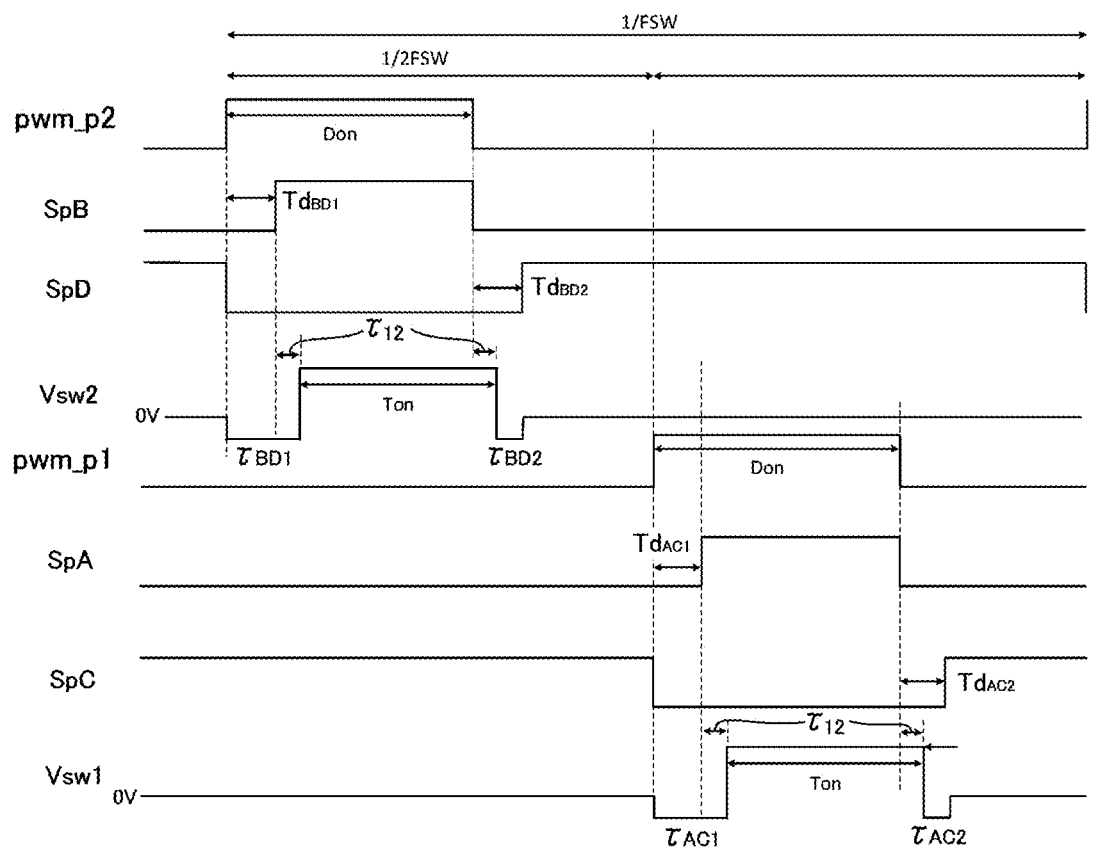
FIG. 11 is an operation waveform diagram of the switching power supply shown in FIG. 10.

FIG. 11 is an operation waveform diagram of the switching power supply shown in FIG. 10. The duty cycle Don is feedback controlled by the pulse width modulator 416. In the drawing, pwm_p1 and pwm_p2 each indicate a pulse signal having the duty cycle Don. Here, tilt represents a delay time from the occurrence of an edge of the control pulse SpB (or SpA) to the occurrence of change in the switching voltage Vsw2 (or Vsw1) based on the edge. The delay time can include the delay of the driver 422B (422A), the turn-on time of the transistor MB, the delay of the transformer TRN, etc.

Directing attention to the pair of transistors MB and MD, the dead time $\tau_{BD1}$ in which the switching voltage Vsw2 becomes negative is represented by the sum total of the control delay $Td_{BD1}$ and the delay time $\tau_{12}$.

$\tau_{BD1} = Td_{BD1} + \tau_{12}$

Furthermore, the dead time $\tau_{BD2}$ is represented by the time obtained by subtracting the delay time $\tau_{12}$ from the control delay $Td_{BD2}$.

$\tau_{BD2} = Td_{BD2} - \tau_{12}$

The dead time controller 414 optimizes the control delay $Td_{BD1}$ based on the sensing voltage Vs2 that corresponds to the length of $\tau_{BD1}$. Furthermore, the dead time controller 414 optimizes the control delay $Td_{BD2}$ based on the sensing voltage Vs2 that corresponds to the length of $\tau_{BD2}$.

Directing attention to the pair of transistors MA and MC, the dead time $\tau_{AC1}$ in which the switching voltage Vsw1 becomes negative is represented by the sum total of the control delay $Td_{AC1}$ and the delay time $\tau_{12}$.

$$\tau_{AC1} = Td_{AC1} + \tau_{12}$$

Furthermore, the dead time $\tau_{AC2}$ is represented by the time obtained by subtracting the delay time $\tau_{12}$ from the control delay $Td_{AC2}$.

$$\tau_{AC2} = Td_{AC2} - \tau_{12}$$

The dead time controller 414 optimizes the control delay $Td_{AC1}$ based on the sensing voltage Vs1 that corresponds to the length of $\tau_{AC1}$. Furthermore, the dead time controller 414 optimizes the control delay $Td_{AC2}$ based on the sensing voltage Vs1 that corresponds to the length of $\tau_{AC2}$.

Example 4

Figure 12:
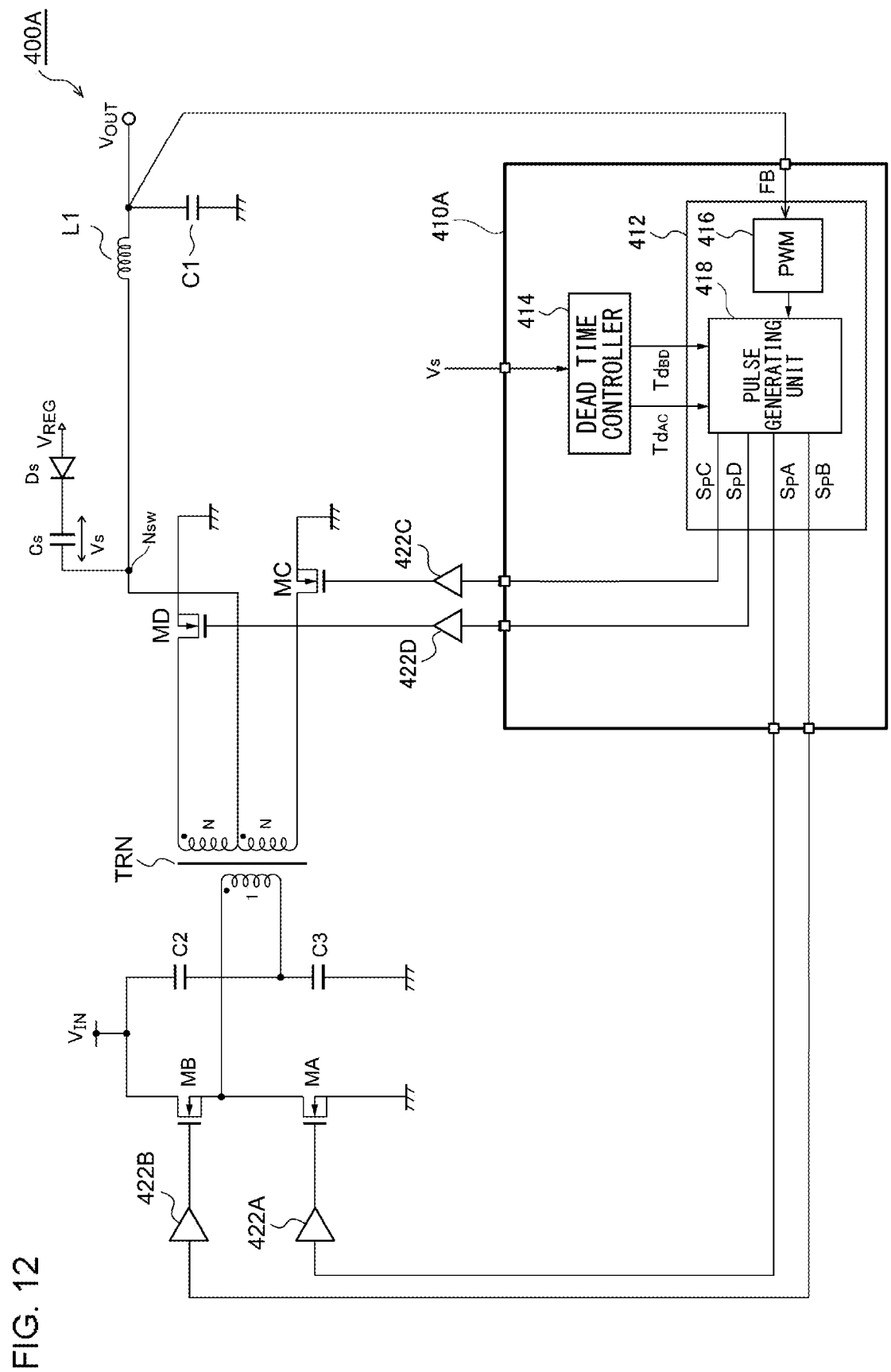
FIG. 12 is a block diagram of a switching power supply according to an example 4.

FIG. 12 is a block diagram of a switching power supply 400A according to an example 4. As with the switching power supply 400 shown in FIG. 10, the switching power supply 400A is configured as a half-bridge converter. However, there is a difference in the position of the switching node between them. FIG. 12 shows an arrangement in which a connection node that couples a tap of a secondary winding of the transformer TRN and the inductor L1 is used as the switching node. The switching power supply 400A includes a capacitor Cs coupled to the switching node Nsw and a rectifier element Ds.

The dead time controller 414 of the control circuit 410A controls the control delays $Td_{AC}$ and $Td_{BD}$ based on the sensing voltage Vs across the capacitor Cs.

Figure 13:
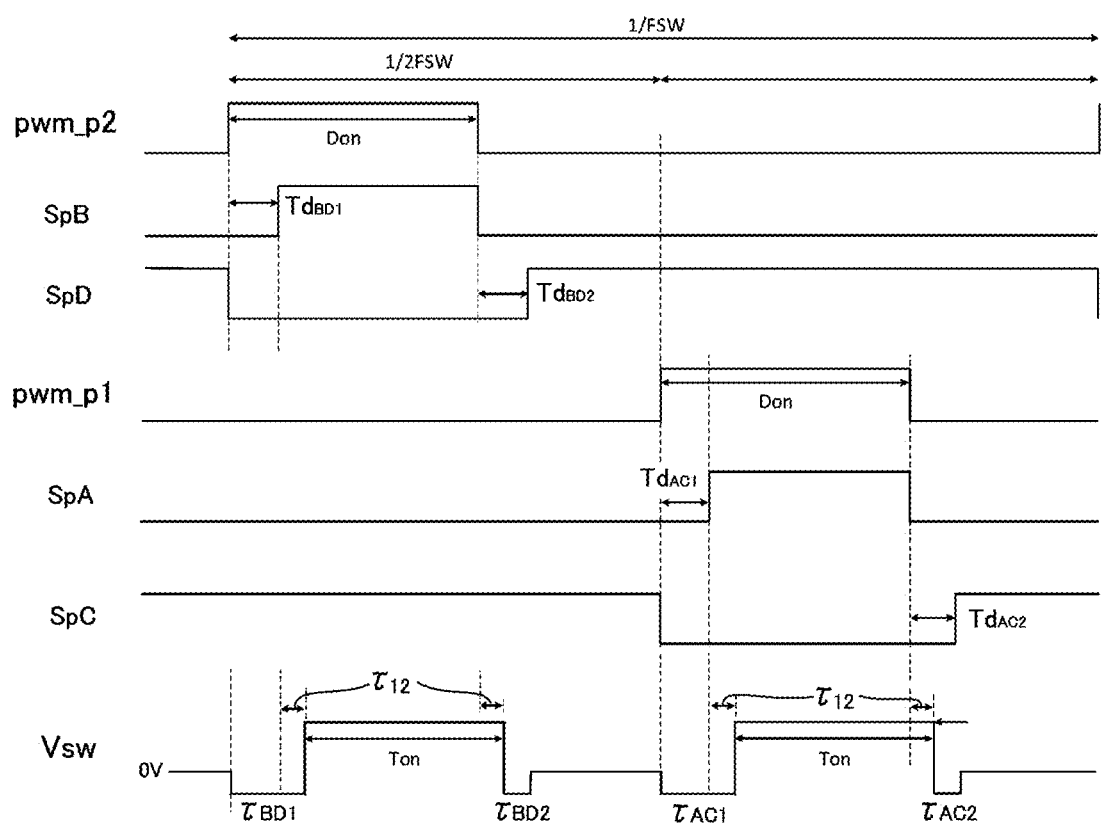
FIG. 13 is an operation waveform diagram of the switching power supply shown in FIG. 12.

FIG. 13 is an operation waveform diagram of the switching power supply 400A shown in FIG. 12. The switching voltage Vsw is a voltage obtained by combining the two switching voltages Vsw1 and Vsw2 shown in FIG. 11. Accordingly, the control delay $Td_{BD1}$ is optimized based on the sensing voltage Vs that corresponds to the length of $\tau_{BD1}$. Furthermore, the control delay $Td_{BD2}$ is optimized based on the sensing voltage Vs that corresponds to the length of $\tau_{BD2}$. In the same manner, the dead time controller 414 optimizes the control delay $Td_{AC1}$ based on the sensing voltage Vs that corresponds to the length of $\tau_{AC1}$. Furthermore, the dead time controller 414 optimizes the control delay $Td_{AC2}$ based on the sensing voltage Vs that corresponds to the length of $\tau_{AC2}$.

With the example 4, this allows the number of parts and the number of pins required for the control circuit 410A to be reduced.

Embodiment 2

Figure 14:
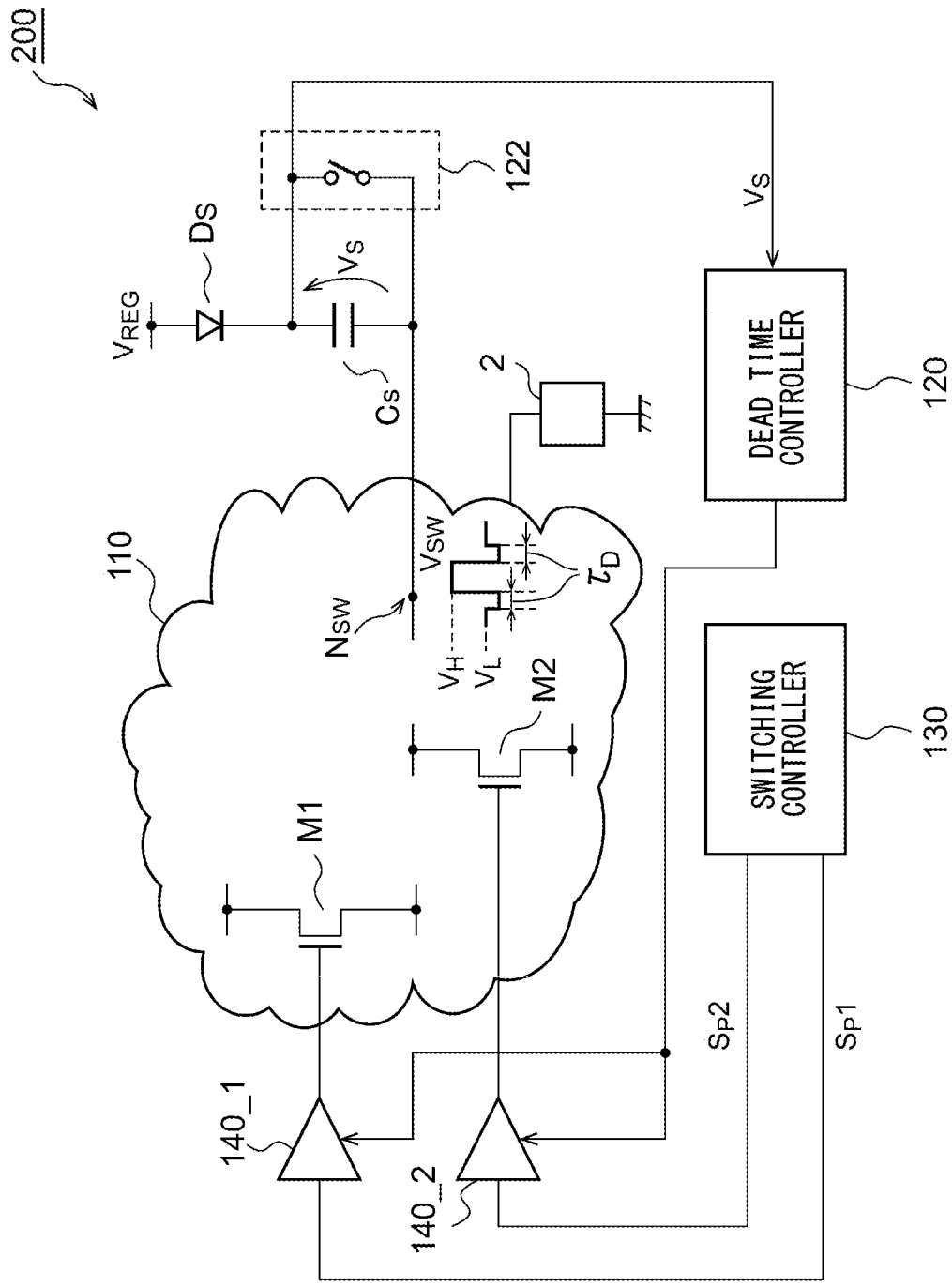
FIG. 14 is a circuit diagram of a switching circuit according to an embodiment 2.

FIG. 14 is a circuit diagram of a switching circuit 200 according to an embodiment 2. Description has been made in the embodiment 1 regarding an arrangement in which the delay time between the edges of the two control pulses Sp1 and Sp2 is optimized. In contrast, in the embodiment 2, the delay time Td of the gate driver is controlled so as to optimize the dead time $\tau_D$.

The switching circuit 200 includes a main circuit 110, a dead time controller 120, a controller 130, and gate drivers 140_1 and 140_2. At least one from among the gate drivers 140_1 and 140_2 is configured to have a variable delay time Td.

For example, the gate driver 140_1 may be configured to be capable of independently controlling the delay time to be applied to a positive edge of the control pulse Sp1 and the delay time to be applied to a negative edge of the control pulse Sp1. In the same manner, the gate driver 140_2 may be configured to be capable of independently controlling the delay time to be applied to a positive edge of the control pulse Sp2 and the delay time to be applied to a negative edge of the control pulse Sp2.

The above is the configuration of the switching circuit 200. With the switching circuit 200, the delay time of the gate driver is controlled, thereby allowing the dead time $\tau_D$ to be optimized.

Embodiment 3

Figure 15:
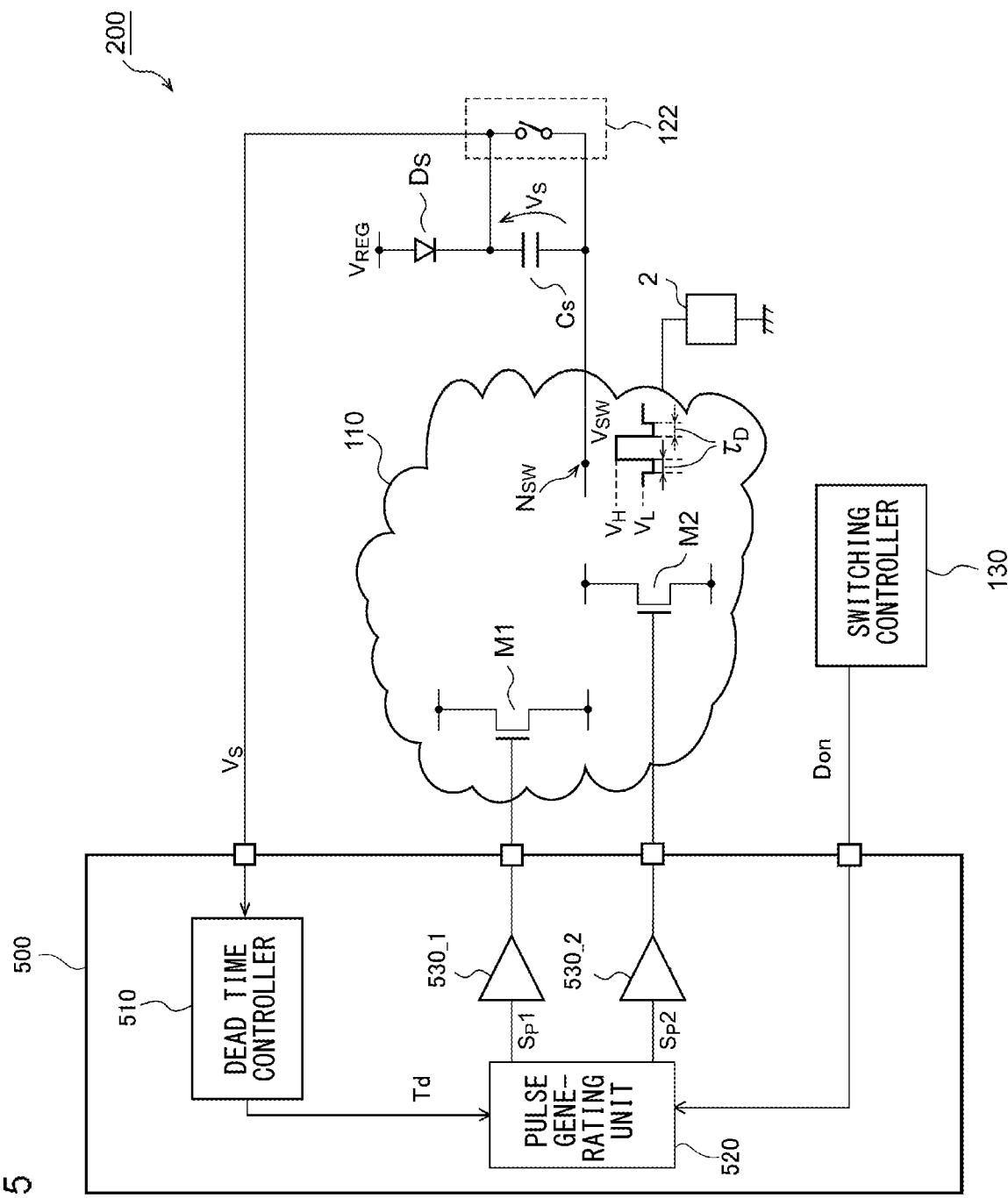
FIG. 15 is a circuit diagram of a switching circuit according to an embodiment 3.

FIG. 15 is a circuit diagram of the switching circuit 200 including the gate driver circuit 500 according to an embodiment 3. The gate driver circuit 500 includes a dead time controller 510, a pulse generating unit 520, a first gate driver 530_1, and a second gate driver 530_2.

The switching controller 130 includes a pulse width modulator. The switching controller 130 generates a control signal that specifies the duty cycle Don of each of the first transistor M1 and the second transistor M2 and supplies the control signal to the gate driver circuit 500. The control signal may be configured as a pulse signal, a digital value, or an analog signal.

The pulse generating unit 520 generates a first control pulse Sp1 and a second control pulse Sp2 each having a duty cycle that corresponds to the control signal received from the switching controller 130.

The dead time controller 510 controls the delay time between the adjacent edges of the first control pulse Sp1 and the second control pulse Sp2 according to the sensing voltage Vs across both ends of the capacitor Cs.

The first gate driver 530_1 drives the first transistor M1 according to the first control pulse Sp1. The second gate driver 530_2 drives the second transistor M2 according to the second control pulse Sp2.

Description has been made above regarding the present invention with reference to the embodiment. The above-described embodiments have been described for exemplary purposes only and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

The topology of the switching power supply is not restricted to such an arrangement described in the embodiments. FIG. 16A through FIG. 16F are diagrams each showing a variation of the switching power supply.

Figure 16C:
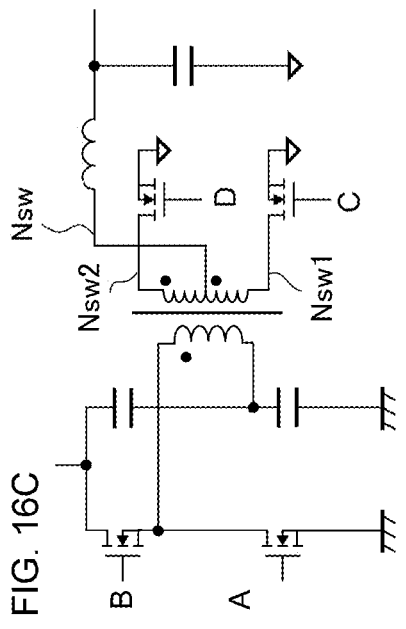
FIG. 16A through FIG. 16F are diagrams each showing a variation of the switching power supply.
Figure 16B:
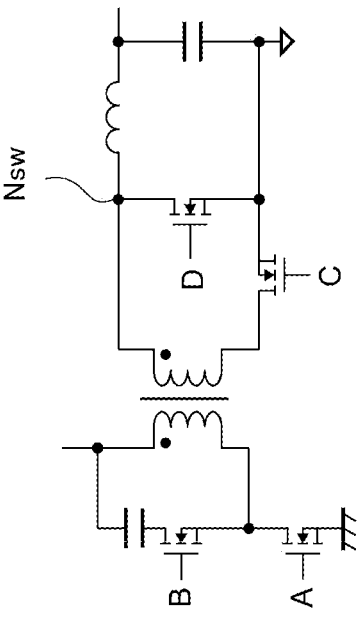
Figure 16A:
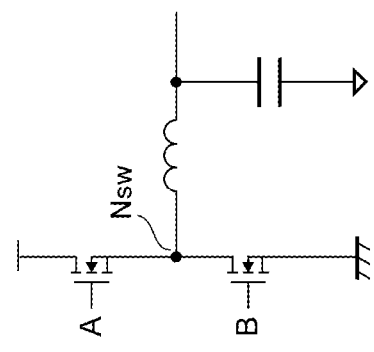

FIG. 16A shows an arrangement in which the switching power supply is configured as a step-down converter, which has been described in the example 2. It should be noted that the architecture of the embodiment 2 or 3 may be applied to the step-down converter. In this case, a connection node that couples the transistors A and B may be employed as a switching node to be used to change the delay time of the gate driver of the transistors A and B.

FIG. 16B shows an arrangement in which the switching power supply is configured as a forward converter, which has been described in the example 1. Description has been made in the example 1 regarding an arrangement in which the dead time between the transistors A and D is controlled.

Instead of or in addition to such an arrangement, the dead time between the transistors A and C (control delay TAO may be controlled. Also, the architecture according to the embodiments 2 or 3 may be applied to the forward converter.

FIG. 16C shows an arrangement in which the switching power supply is configured as a half-bridge converter, which has been described in the examples 3 and 4. The architecture according to the embodiment 2 or 3 may be applied to the half-bridge converter.

Figure 16F:
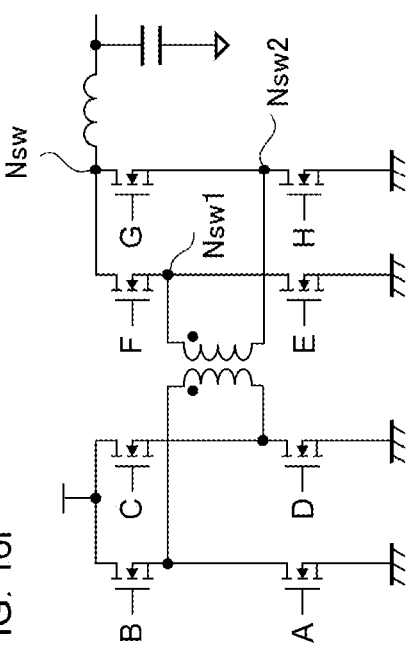
Figure 16E:
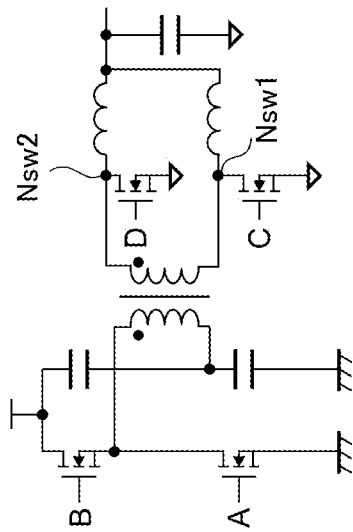
Figure 16D:
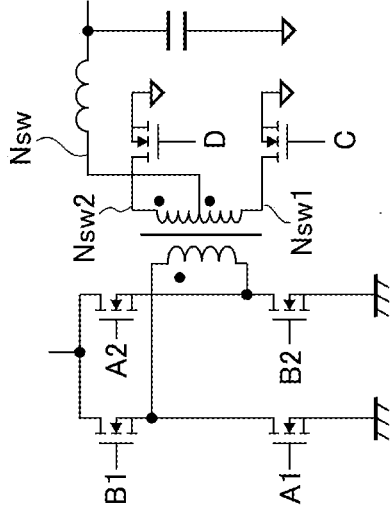

FIG. 16D shows an arrangement in which the switching power supply is configured as a full-bridge converter. The full-bridge converter has the same configuration on the secondary side as that of the half-bridge converter. The full-bridge converter is controlled such that, on the primary side, the transistor pair A1 and A2 are turned on at the same time and the transistor pair B1 and B2 are turned on at the same time.

Accordingly, the dead time can be optimized in the same manner as in the half-bridge converter described in the example 3 or 4. Specifically, the operation of the transistor A can be regarded as the operation of the transistor pair A1 and A2, and the operation of the transistor B can be regarded as the operation of the transistor pair B1 and B2. In order to provide optimization, either the architecture according to the embodiment 1 or 2 may preferably be employed.

FIG. 16E shows an arrangement in which the switching power supply is configured as a current-doubler synchronous rectifier. In this arrangement, a pair of transistors A and C are operated in a complementary manner. The control delay $Td_{AC}$ between the transistors A and C is optimized using the drain of the transistor C as the switching terminal. Furthermore, a pair of transistors B and D are operated in a complementary manner. The control delay $Td_{DB}$ between the transistors B and D is optimized using the drain of the transistor D as the switching terminal.

FIG. 16F shows an arrangement in which the switching power supply is configured as a secondary-side full-bridge synchronous rectifier. In the full-bridge circuit on the primary side, the transistor pair A and C are turned on and off at the same time, and the transistor pair B and D are turned on and off at the same time. Furthermore, in the full-bridge circuit on the secondary side, the transistor pair E and G are turned on and off at the same time, and the transistor pair F and H are turned on and off at the same time. In this arrangement, this is capable of optimizing a control delay (dead time) $Td_{AE}$ between the transistor pair A and C and the transistor pair E and G based on the sensing voltage Vs1 that corresponds to the switching voltage Vsw1 using the drain of the transistor E as the switching node Nsw1. Furthermore, this is capable of optimizing a control delay (dead time) $Td_{BF}$ between the transistor pair B and D and the transistor pair F and H based on the sensing voltage Vs2 that corresponds to the switching voltage Vsw2 using the drain of the transistor H as the switching node Nsw2.

Alternatively, in FIG. 15F, with a connection node that couples the secondary-side full-bridge circuit and the secondary-side inductor as a switching node Nsw, the control delays $Td_{AE}$ and $Td_{BF}$ may be optimized based on a voltage at the switching node Nsw.

In addition to power supplies, switching circuits have been used in various kinds of applications such as motor driving circuits, etc. The present invention is applicable to various kinds of usages in addition to the power supplies.

While the preferred embodiments of the present disclosure have been described using specific terms, such description is for illustrative purposes only, and it is to be understood that changes and variations may be made without departing from the spirit or scope of the appended claims.

What is claimed is:

1. A switching circuit comprising:
   a first transistor and a second transistor;
   a switching node, wherein a high-level voltage occurs at the switching node during a period in which the first transistor is turned on and the second transistor is turned off, a low-level voltage occurs at the switching node during a period in which the first transistor is turned off and the second transistor is turned on, and a negative voltage occurs at the switching node during a period in which both the first transistor and the second transistor are turned off;
   a capacitor structured such that a first end thereof is coupled to the switching node;
   a rectifier element structured to apply a constant voltage to a second end of the capacitor;
   a switching controller structured to generate a first control pulse and a second control pulse for specifying on/off states of the first transistor and the second transistor;
   a first gate driver structured to drive the first transistor according to the first control pulse;
   a second gate driver structured to drive the second transistor according to the second control pulse;
   a dead time controller structured to control a delay time between edges of the first control pulse and the second control pulse according to a sensing voltage across both ends of the capacitor; and
   a discharge circuit coupled to the capacitor, and structured to discharge a charge stored in the capacitor in a period in which the first transistor is turned on.

2. The switching circuit according to claim 1, wherein the dead time controller comprises a comparator structured to compare a voltage across both ends of the capacitor with a predetermined target voltage,
   and wherein the dead time controller increases or decreases the delay time according to an output of the comparator.

3. The switching circuit according to claim 1, wherein the dead time controller feedback controls the delay time such that a voltage across both ends of the capacitor approaches a predetermined target voltage.

4. The switching circuit according to claim 1, wherein the dead time controller independently controls the delay time when the first transistor is turned on and the delay time when the second transistor is turned on.

5. The switching circuit according to claim 1, further comprising a transformer comprising a primary winding and a secondary winding,
   wherein the first transistor is coupled to the primary winding,
   wherein the second transistor is coupled to the secondary winding,
   and wherein a connection node that couples the secondary winding and the second transistor is employed as the switching node.

6. The switching circuit according to claim 1, wherein the first transistor and the second transistor are coupled in series,
   and wherein a connection node that couples the first transistor and the second transistor is employed as the switching node.

7. A switching power supply comprising the switching circuit according to claim 1.

8. A control circuit for a switching power supply, wherein a switching circuit comprises:
   a first transistor and a second transistor;

a switching node, wherein a high-level voltage occurs at the switching node during a period in which the first transistor is turned on and the second transistor is turned off, a low-level voltage occurs at the switching node during a period in which the first transistor is turned off and the second transistor is turned on, and a negative voltage occurs at the switching node during a period in which both the first transistor and the second transistor are turned off;
a capacitor structured such that a first end thereof is coupled to the switching node;
a rectifier element structured to apply a constant voltage to a second end of the capacitor;
a first gate driver structured to drive the first transistor according to a first control pulse;
a second gate driver structured to drive the second transistor according to a second control pulse; and
a discharge circuit structured to discharge a charge stored in the capacitor in a period in which the first transistor is turned on,
and wherein the control circuit comprises:
a switching controller structured to generate the first control pulse and the second control pulse for specifying on/off states of the first transistor and the second transistor; and
a dead time controller structured to control a delay time between adjacent edges of the first control pulse and the second control pulse according to a sensing voltage across both ends of the capacitor.

9. A switching circuit comprising:
a first transistor and a second transistor;
a switching node, wherein a high-level voltage occurs at the switching node during a period in which the first transistor is turned on and the second transistor is turned off, a low-level voltage occurs at the switching node during a period in which the first transistor is turned off and the second transistor is turned on, and a negative voltage occurs at the switching node during a period in which both the first transistor and the second transistor are turned off;
a capacitor structured such that a first end thereof is coupled to the switching node;
a rectifier element structured to apply a constant voltage to a second end of the capacitor;
a switching controller structured to generate a first control pulse and a second control pulse for specifying on/off states of the first transistor and the second transistor;
a first gate driver structured to drive the first transistor according to the first control pulse;
a second gate driver structured to drive the second transistor according to the second control pulse;
a dead time controller structured to control a delay time of at least one from among the first gate driver and the second gate driver according to a sensing voltage across both ends of the capacitor; and
a discharge circuit coupled to the capacitor, and structured to discharge a charge stored in the capacitor in a period in which the first transistor is turned on.

10. The control circuit according to claim 8, wherein the dead time controller comprises a comparator structured to compare a voltage across both ends of the capacitor with a predetermined target voltage,
and wherein the dead time controller increases or decreases the delay time according to an output of the comparator.

11. The control circuit according to claim 8, wherein the dead time controller feedback controls the delay time such that a voltage across both ends of the capacitor approaches a predetermined target voltage.

12. The control circuit according to claim 8, wherein the dead time controller independently controls the delay time when the first transistor is turned on and the delay time when the second transistor is turned on.

13. The control circuit according to claim 8, further comprising a transformer comprising a primary winding and a secondary winding,
wherein the first transistor is coupled to the primary winding,
wherein the second transistor is coupled to the secondary winding,
and wherein a connection node that couples the secondary winding and the second transistor is employed as the switching node.

14. The control circuit according to claim 8, wherein the first transistor and the second transistor are coupled in series,
and wherein a connection node that couples the first transistor and the second transistor is employed as the switching node.

15. A switching power supply comprising the control circuit according to claim 8.

16. A gate driver circuit for a switching power supply, wherein the switching power supply comprises:
a first transistor and a second transistor;
a switching node, wherein a high-level voltage occurs at the switching node during a period in which the first transistor is turned on and the second transistor is turned off, a low-level voltage occurs at the switching node during a period in which the first transistor is turned off and the second transistor is turned on, and a negative voltage occurs at the switching node during a period in which both the first transistor and the second transistor are turned off;
a capacitor structured such that a first end thereof is coupled to the switching node;
a rectifier element structured to apply a constant voltage to a second end of the capacitor; and
a switching controller structured to generate a control signal for specifying a duty cycle of each of the first transistor and the second transistor such that an electrical state of the switching power supply approaches a target state,
and wherein the gate driver circuit comprises:
a pulse generating unit structured to generate a first control pulse and a second control pulse each having a duty cycle that corresponds to the control signal;
a first gate driver structured to drive the first transistor according to the first control pulse;
a second gate driver structured to drive the second transistor according to the second control pulse;
a dead time controller structured to control a delay time between adjacent edges of the first control pulse and the second control pulse according to a sensing voltage across both ends of the capacitor; and
a discharge circuit structured to discharge a charge stored in the capacitor in a period in which the first transistor is turned on.

17. The gate driver circuit according to claim 16, wherein the dead time controller increases or decreases the delay time based on a comparison result between a predetermined target voltage and a voltage across both ends of the capacitor.

18. The gate driver circuit according to claim 16, wherein the dead time controller feedback controls the delay time such that a voltage across both ends of the capacitor approaches a predetermined target voltage.

19. The gate driver circuit according to claim 16, wherein the dead time controller independently controls the delay time when the first transistor is turned on and the delay time when the second transistor is turned on.

20. The gate driver circuit according to claim 16, further comprising a transformer comprising a primary winding and a secondary winding,
- wherein the first transistor is coupled to the primary winding,
- wherein the second transistor is coupled to the secondary winding,
- and wherein a connection node that couples the secondary winding and the second transistor is employed as the switching node.

21. The gate driver circuit according to claim 16, wherein the first transistor and the second transistor are coupled in series,
- and wherein a connection node that couples the first transistor and the second transistor is employed as the switching node.

22. A switching power supply comprising the switching circuit according to claim 16.

* * * * *